United States Patent

Keith et al.

[11] Patent Number: 5,991,451
[45] Date of Patent: Nov. 23, 1999

[54] VARIABLE-LENGTH ENCODING USING CODE SWAPPING

[75] Inventors: Michael Keith, Portland, Oreg.; Joseph N. Romriell, Hyde Park, Utah; Rohit Agarwal, Portland, Oreg.; Stuart Golin, East Windsor, N.J.

[73] Assignee: Intel Corporation, Santa Clara, Calif.

[21] Appl. No.: 08/608,432

[22] Filed: Feb. 28, 1996

Related U.S. Application Data

[63] Continuation-in-part of application No. 08/409,514, Mar. 23, 1995, Pat. No. 5,793,896.
[60] Provisional application No. 60/010,518, Jan. 24, 1996.

[51] Int. Cl.$^6$ .............................. G06K 9/36; G06K 9/46; H03U 7/40; H03U 7/00

[52] U.S. Cl. ......................... 382/246; 382/232; 382/239; 382/244; 341/67; 341/107

[58] Field of Search .................................... 382/232, 237, 382/239, 244, 246; 358/427, 432, 539, 426, 430; 341/67, 107, 51, 61, 65; 348/390, 393, 387, 404

[56] References Cited

U.S. PATENT DOCUMENTS 5,793,896   8/1998   Golin ...................................... 382/246

*Primary Examiner*—Bijan Tadayon
*Assistant Examiner*—Dmitry A. Novic
*Attorney, Agent, or Firm*—William H. Murray; N. Stephan Kinsella

[57] ABSTRACT

The efficiency of variable-length (VL) encoding data using a defined VL encoding table is characterized and one or more changes to one or more entries of the defined VL encoding table are determined that increase the efficiency of encoding the data. An updated VL encoding table is generated from the defined VL encoding table based on the changes. VL codes for the data are generated using the updated VL encoding table, and an encoded bitstream is generated from VL codes, wherein the encoded bitstream explicitly identifies the changes. For decoding, the changes are extracted from the encoded bitstream and an updated VL decoding table is generated from a defined VL decoding table corresponding to the defined VL encoding table, based on the changes. The VL codes in the encoded bitstream are decoded using the updated VL decoding table to generate a set of decoded data.

48 Claims, 7 Drawing Sheets

FIG. 1. ENCODING SYSTEM

FIG. 2. DECODING SYSTEM

FIG. 3. ENCODE PROCESSING

FIG. 4. DECODE PROCESSING

FIG. 5

| FIXED-LENGTH DATA | VARIABLE-LENGTH CODES |
|---|---|
| 0-1 | 0X |
| 2-5 | 10XX |
| 6-13 | 110XXX |
| 14-29 | 1110XXXX |
| 30-61 | 11110XXXXX |
| 62-125 | 111110XXXXXX |
| 126-253 | 1111110XXXXXXX |

VARIABLE-LENGTH ENCODING USING CODE SWAPPING

CROSS-REFERENCES TO RELATED APPLICATIONS

This application is a continuation-in-part of U.S. patent application No. 08/409,514, now U.S. Pat. No. 5,793,896, filed Mar. 23, 1995, this application claims the benefit of U.S. Provisional application No. 60/010,518 filed Jan. 24, 1996.

BACKGROUND OF THE INVENTION

1. Field of the Invention

The present invention relates to signal processing, and, in particular, to encoding video and other image signals using variable-length encoding techniques.

2. Description of the Related Art

In digital video encoding, it is common to employ variable-length encoding techniques to compress data representative of the video signals. In variable-length encoding, more frequently occurring data values are represented in the resulting encoded bitstream using shorter codes, while longer codes are reserved for those data values that occur less frequently. In this way, the total number of bits used to represent all of the data can be smaller than the number of bits used to represent the data using a fixed-length scheme.

Many video encoding schemes use a defined set of variable-length (VL) codes to represent a set of fixed-length data. A huffman table is such a defined set of VL codes. Both the encoders and decoders that conform to such a video encoding scheme may be preprogrammed with a particular huffman table. A conforming decoder will then be able to apply the preprogrammed huffman table to decode the VL codes in a bitstream generated by a conforming encoder. Alternatively, the structure of the huffman table may be defined in the bitstream. The decoder may then generate the huffman table from its defined structure.

A defined huffman table will provide optimal VL encoding for a set of fixed-length data, if the statistics of the data match those of the huffman table. If the actual fixed-length data to be encoded has a probability distribution that differs sufficiently from the statistics of the defined huffman table, then that huffman table will provide less than optimal VL encoding for that set of data. What is needed is a scheme for improving the VL encoding of a wide variety of fixed-length data using a defined huffman table.

Further objects and advantages of this invention will become apparent from the detailed description of a preferred embodiment which follows.

SUMMARY OF THE INVENTION

The present invention comprises a computer-implemented process, an apparatus, and a storage medium encoded with machine-readable computer program code for encoding signals. According to a preferred embodiment, data representing physical subject matter is provided to be variable-length (VL) encoded using a defined VL encoding table. The efficiency of encoding the data using the defined VL encoding table is characterized and one or more changes to one or more entries of the defined VL encoding table are determined that increase the efficiency of encoding the data. An updated VL encoding table is generated from the defined VL encoding table based on the changes. VL codes for the data are generated using the updated VL encoding table, and an encoded bitstream is generated from VL codes, wherein the encoded bitstream explicitly identifies the changes.

The present invention also comprises a computer-implemented process, an apparatus, and a storage medium encoded with machine-readable computer program code for decoding variable-length (VL) encoded signals. According to a preferred embodiment, an encoded bitstream comprising VL codes representing physical subject matter is provided, wherein the VL codes were generated using a defined VL encoding table that had been updated using one or more changes to one or more entries of the defined VL encoding table, and the changes were explicitly encoded into the encoded bitstream. The changes are extracted from the encoded bitstream and an updated VL decoding table is generated from a defined VL decoding table corresponding to the defined VL encoding table, based on the changes. The VL codes are decoded using the updated VL decoding table to generate a set of decoded data.

BRIEF DESCRIPTION OF THE DRAWINGS

Other objects, features, and advantages of the present invention will become more fully apparent from the following detailed description of the preferred embodiment, the appended claims, and the accompanying drawings in which:

FIG. 5 is an example of a huffman table for variable-length encoding of fixed-length data;

DESCRIPTION OF THE PREFERRED EMBODIMENT(S)

The present invention is directed to, for example, variable-length encoding and decoding using a defined huffman table, where one or more pairs of huffman codes are swapped to improve the efficiency with which the fixed-length data values are variable-length encoded (i.e., to reduce the size of the encoded bitstream). In order for the decoder to be able to decode the variable-length encoded data properly, the encoded bitstream explicitly identifies the huffman codes swapped by the encoder.

System Hardware Architectures

Figure 1:
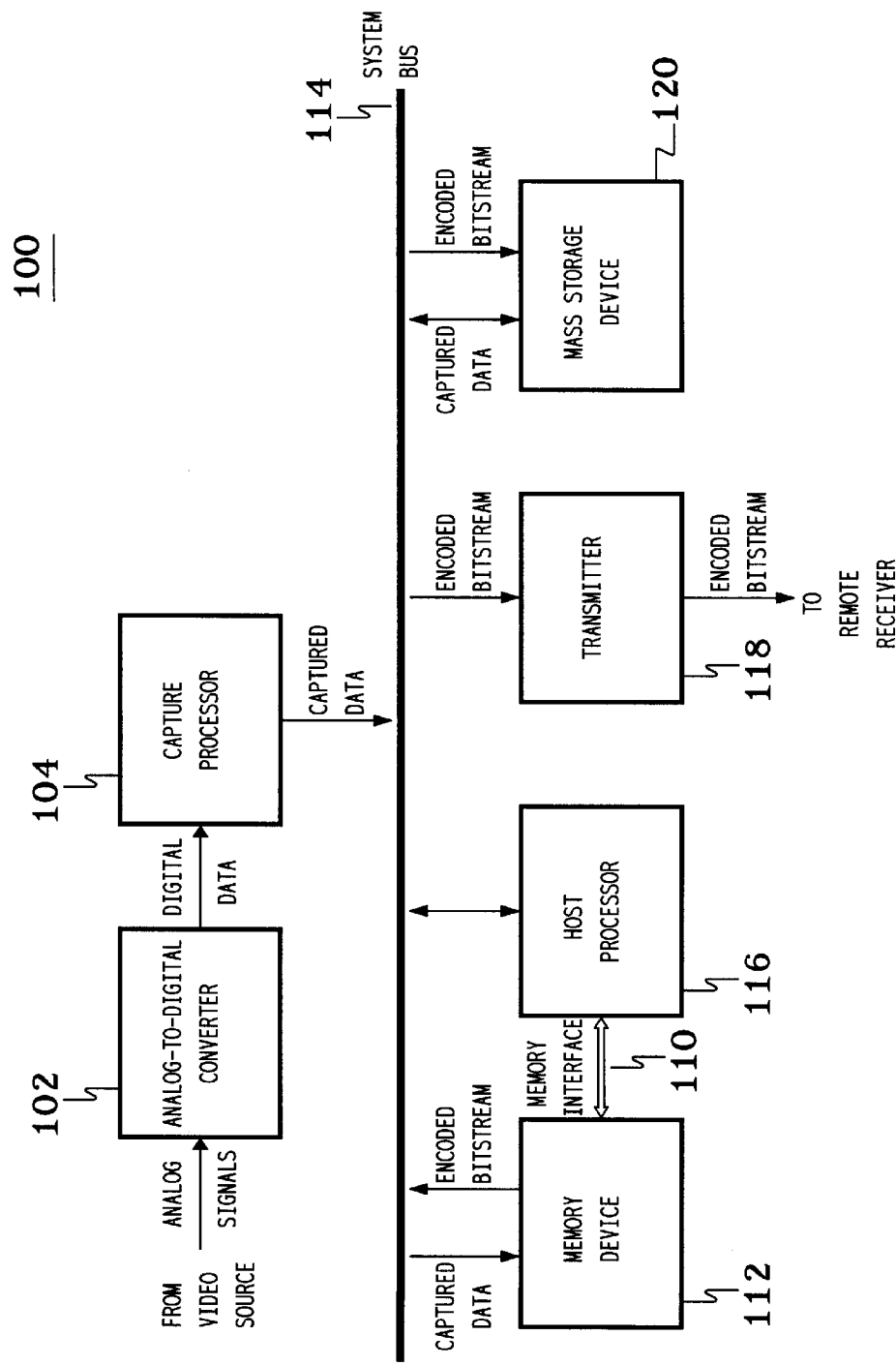
FIG. 1 is a block diagram of a video system for encoding video signals in a PC environment, according to a preferred embodiment of the present invention.

Referring now to FIG. 1, there is shown a computer system 100 for encoding video signals, according to a preferred embodiment of the present invention. Analog-to-digital (A/D) converter 102 of encoding system 100 receives analog video signals from a video source. The video source may be any suitable source of analog video signals such as a video camera or VCR for generating local analog video signals or a video cable or antenna for receiving analog video signals from a remote source. A/D converter 102 separates the analog video signal into constituent components and digitizes the analog components into digital video component data (e.g., in one embodiment, 24-bit RGB component data).

Capture processor 104 captures the digital 3-component video data received from converter 102. Capturing may include one or more of color conversion (e.g., RGB to YUV), scaling, and subsampling. Each captured video frame is represented by a set of three two-dimensional component planes, one for each component of the digital video data. In one embodiment, capture processor 104 captures video data in a YUV9 (i.e., YUV 4:1:1) format, in which every (4×4) block of pixels of the Y-component plane corresponds to a single pixel in the U-component plane and a single pixel in the V-component plane.

Capture processor 104 selectively stores the captured data to memory device 112 and/or mass storage device 120 via system bus 114. Those skilled in the art will understand that, for real-time encoding, the captured data are preferably stored to memory device 112, while for non-real-time encoding, the captured data are preferably stored to mass storage device 120. For non-real-time encoding, the captured data will subsequently be retrieved from mass storage device 120 and stored in memory device 112 for encode processing by host processor 116.

During encoding, host processor 116 reads the captured bitmaps from memory device 112 via high-speed memory interface 110 and generates an encoded video bitstream that represents the captured video data. Depending upon the particular encoding scheme implemented, host processor 116 applies a sequence of compression steps to reduce the amount of data used to represent the information in the video images. The resulting encoded video bitstream is then stored to memory device 112 via memory interface 110. Host processor 116 may copy the encoded video bitstream to mass storage device 120 for future playback and/or transmit the encoded video bitstream to transmitter 118 for real-time transmission to a remote receiver (not shown in FIG. 1).

Figure 2:
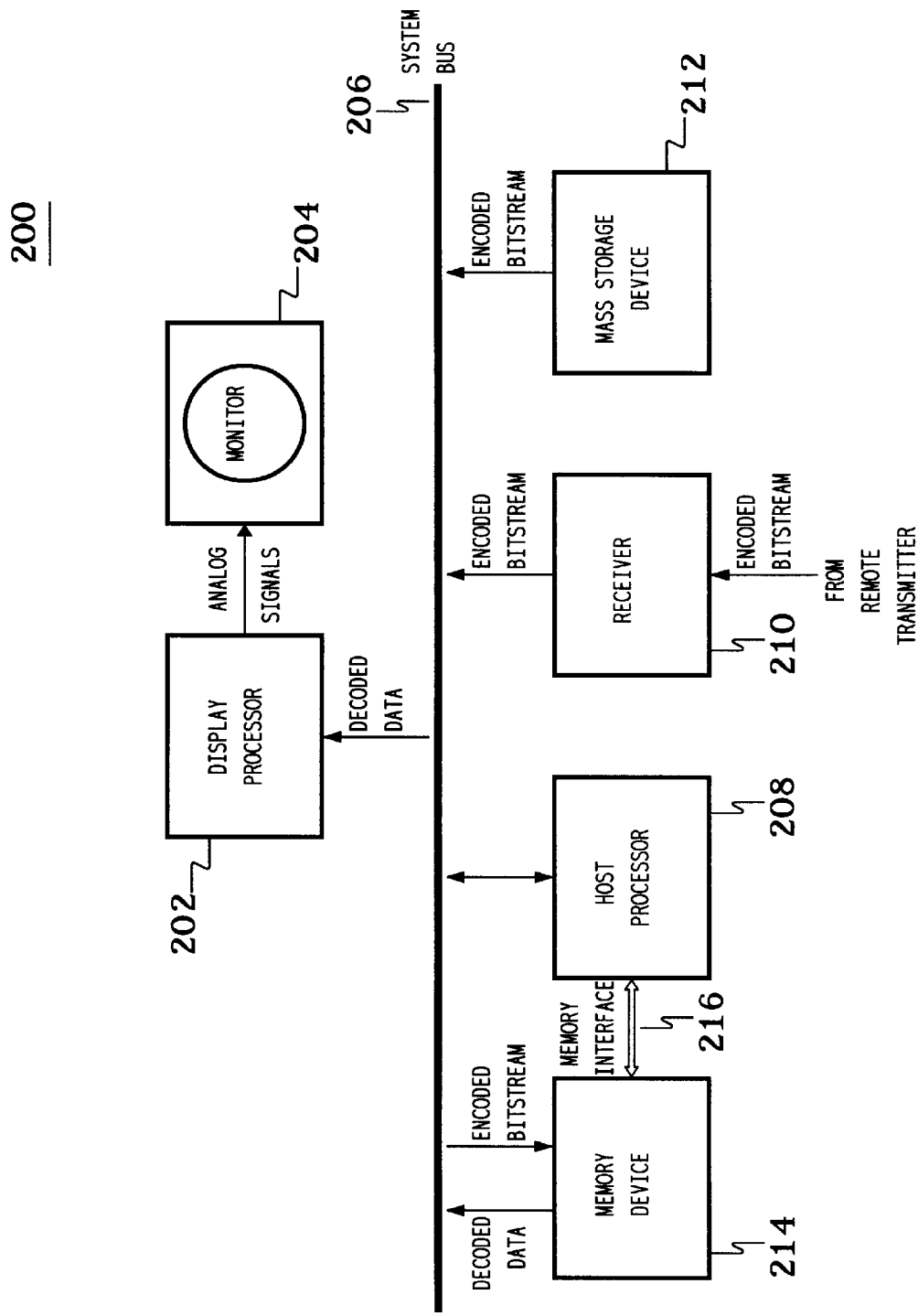
FIG. 2 is a computer system for decoding the video signals encoded by the computer system of FIG. 1, according to a preferred embodiment of the present invention.

Referring now to FIG. 2, there is shown a computer system 200 for decoding the encoded video bitstream encoded by encoding system 100 of FIG. 1, according to a preferred embodiment of the present invention. The encoded video bitstream is either read from mass storage device 212 of decoding system 200 or received by receiver 210 from a remote transmitter, such as transmitter 118 of FIG. 1. The encoded video bitstream is stored to memory device 214 via system bus 206.

Host processor 208 accesses the encoded video bitstream stored in memory device 214 via high-speed memory interface 216 and decodes the encoded video bitstream for display. Decoding the encoded video bitstream involves undoing the compression processing implemented by encoding system 100 of FIG. 1. Host processor 208 stores the resulting decoded video data to memory device 214 via memory interface 216 from where the decoded video data are transmitted to display processor 202 via system bus 206. Alternatively, host processor 208 transmits the decoded video data directly to display processor 202 via system bus 206. Display processor 202 processes the decoded video data for display on monitor 204. The processing of display processor 202 includes digital-to-analog conversion of the decoded video data. After being decoded by host processor 208 but before being D/A converted by display processor 202, the decoded video data may be upsampled (e.g., from YUV9 to YUV24), scaled, and/or color converted (e.g., from YUV24 to RGB24). Depending upon the particular embodiment, each of these processing steps may be implemented by either host processor 208 or display processor 202.

Referring again to FIG. 1, encoding system 100 is preferably a microprocessor-based personal computer (PC) system with a special purpose video-processing plug-in board. In particular, A/D converter 102 may be any suitable means for decoding and digitizing analog video signals. Capture processor 104 may be any suitable processor for capturing digital video component data as subsampled frames. In a preferred embodiment, A/D converter 102 and capture processor 104 are contained in a single plug-in board capable of being added to a microprocessor-based PC system.

Host processor 116 may be any suitable means for controlling the operations of the special-purpose video processing board and for performing video encoding. Host processor 116 is preferably a general-purpose microprocessor manufactured by Intel Corporation, such as an i486™, Pentium®, or Pentium® Pro processor. System bus 114 may be any suitable digital signal transfer device and is preferably a peripheral component interconnect (PCI) bus. Memory device 112 may be any suitable computer memory device and is preferably one or more dynamic random access memory (DRAM) devices. High-speed memory interface 110 may be any suitable means for interfacing between memory device 112 and host processor 116. Mass storage device 120 may be any suitable means for storing digital data and is preferably a computer hard drive. Transmitter 118 may be any suitable means for transmitting digital data to a remote receiver. Those skilled in the art will understand that the encoded video bitstream may be transmitted using any suitable means of transmission such as telephone line, RF antenna, local area network, or wide area network.

Referring again to FIG. 2, decoding system 200 is preferably a microprocessor-based PC system similar to the basic PC system of encoding system 100. In particular, host processor 208 may be any suitable means for decoding an encoded video bitstream and is preferably a general purpose microprocessor manufactured by Intel Corporation, such as an i486™, Pentium®, or Pentium® Pro processor. System bus 206 may be any suitable digital data transfer device and is preferably a PCI bus. Mass storage device 212 may be any suitable means for storing digital data and is preferably a CD-ROM device or a hard drive. Receiver 210 may be any suitable means for receiving the digital data transmitted by transmitter 118 of encoding system 100. Display processor 202 and monitor 204 may be any suitable devices for processing and displaying video images (including the conversion of digital video data to analog video signals) and are preferably parts of a PC-based display system having a PCI graphics board and a 24-bit RGB monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encode and decode video images. Those skilled in the art will understand that such a combined system may be used to display decoded video images in real-time to monitor the capture and encoding of video stream.

In alternative embodiments of present invention, the video encode processing of an encoding system and/or the video decode processing of a decoding system may be assisted by a pixel processor or other suitable component(s) to off-load processing from the host processor by performing computationally intensive operations.

Software Architecture for Video Encoding

Figure 3:
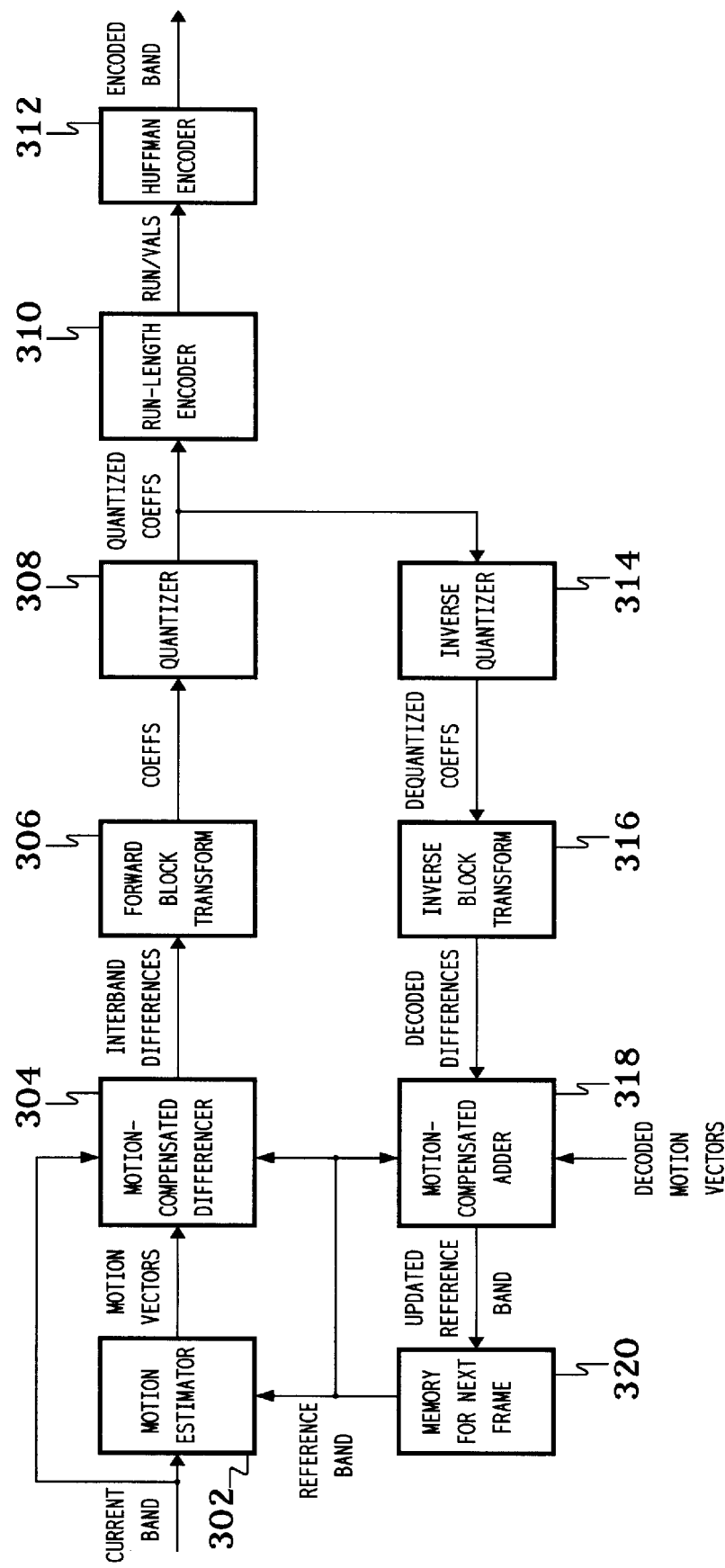
FIG. 3 is a block diagram of the software architecture for the video encoding processing implemented on the host processor of the encoding system of FIG. 1.

Referring now to FIG. 3, there is shown a block diagram of the software architecture for the video encoding processing implemented on host processor 116 of encoding system 100 of FIG. 1, according to a preferred embodiment of the present invention. FIG. 3 shows inter-frame encoding for a band of frame data. Those skilled in the art will understand that, in a video codec that employs interframe encoding, some of the frames are preferably encoded using only intraframe encoding. It will be further understood that each block of an inter-encoded frame may be encoded as either an intra block (i.e, using intraframe encoding) or a difference block (i.e., using interframe encoding). The encoding of intra blocks is equivalent to the encoding of difference blocks shown in FIG. 3, except that the motion estimation of 302 and motion-compensated differencing of 304 are not performed.

For interframe encoding, motion estimator 302 of FIG. 3 performs motion estimation on macroblocks of the current band relative to a reference band to generate a set of motion vectors for the current band. Motion-compensated differencer 304 applies the appropriate motion vectors to the reference band to generate a motion-compensated reference band. Differencer 304 also generates interband differences for the current band using the motion-compensated reference band and the current band.

A forward block transform 306 (e.g., a DCT or slant transform) is applied to each block to generate coefficients for the current band. Quantizer 308 quantizes the coefficients to generate quantized coefficients for the current band. Run-length encoder 310 transforms the quantized coefficients into run-length encoded (RLE) data. In a preferred embodiment, the RLE data for each block of quantized coefficients consist of a sequence of run/val pairs, where each run/val pair is a non-zero quantized coefficient followed by a value corresponding to a run of zero coefficients (i.e., coefficients that are quantized to zero). In a preferred embodiment, the run-length encoding follows an adaptively-generated pattern that tends to provide a long run of zero coefficients for the last run of the block. Huffman encoder 312 applies Huffman-type entropy (a.k.a. statistical or variable-length) coding to the RLE data to generate the encoded data for the current band.

The encode processing of FIG. 3 also includes the decoding of the encoded band to update the reference band used in encoding the corresponding band of another video frame. Since the run-length and Huffman encoding are lossless encoding steps, the decode loop of the encode processing preferably begins at inverse quantizer 314, which dequantizes the quantized coefficients to generate dequantized coefficients for the current band. Inverse block transform 316 applies the inverse of forward block transform 306 to the dequantized coefficients to generate decoded differences for the current band. Motion-compensated adder 318 applies decoded motion vectors (generated by decoding the encoded motion vectors for the current band) to the current reference band to generate motion-compensated reference band data. Adder 318 also performs interband addition using the motion-compensated reference band data and the decoded differences to generate an updated reference band. The updated reference band is stored in memory 320 for use as the reference band in encoding the corresponding band of another video frame.

Software Architecture for Video Decoding

Figure 4:
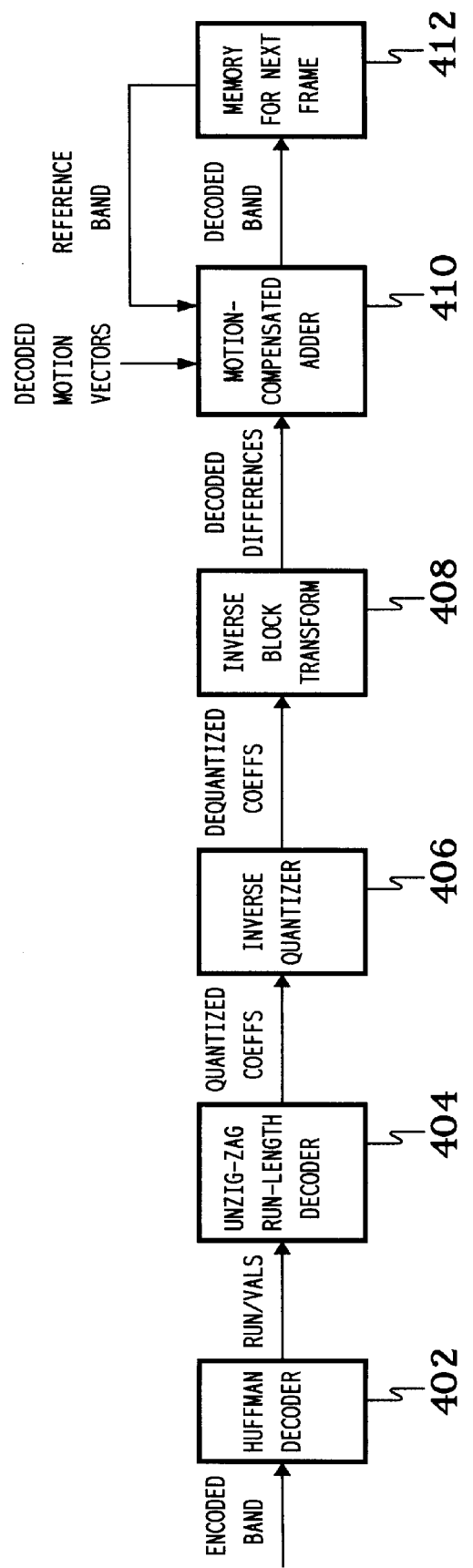
FIG. 4 is a block diagram of the software architecture for the video decoding processing implemented on the host processor of the decoding system of FIG. 2.

Referring now to FIG. 4, there is shown a block diagram of the software architecture for the video decoding processing implemented on host processor 208 of decoding system 200 of FIG. 2, according to a preferred embodiment of the present invention. The decode processing of FIG. 4 reverses the encode processing of FIG. 3. As such, FIG. 4 shows the decoding of inter-frame encoded data corresponding to a band of frame data. The decoding of intra-frame encoded data is equivalent to the decoding of inter-frame encoded data shown in FIG. 4, except that the motion-compensated addition of 410 is not performed.

In particular, Huffman decoder 402 of FIG. 4 applies statistical decoding to the encoded data for the current band to reconstruct the run-length encoded run/val data. Run-length decoder 404 transforms the RLE data into quantized coefficients. Inverse quantizer 406 dequantizes the quantized coefficients to generate dequantized coefficients. Inverse block transform 408 applies the inverse of forward block transform 306 of FIG. 3 to the dequantized coefficients to generate decoded differences.

Motion-compensated adder 410 applies the decoded motion vectors to the reference band to generate motion-compensated reference band data, and performs inter-band addition using the motion-compensated reference band data and the decoded differences to generate the decoded data for the current band. The decoded band is then stored in memory 412 for use as the reference band for decoding the corresponding band of another video frame.

Variable-Length Encoding/Decoding

Referring now to FIG. 5, there is shown an example of a huffman table for VL encoding of fixed-length data. Each row of the huffman table is defined by a prefix (i.e., a particular number of ones followed by a zero) and a suffix (i.e., a particular number of "free" bits). The letter "X" in the suffix indicates that each free bit can be either "0" or "1". Thus, according to the huffman table of FIG. 5, the decimal value 0 is represented in binary notation by the 2-bit VL code 00. Similarly, decimal value 1 is represented by the 2-bit VL code 01; decimal value 2 is represented by the 4-bit VL code 1000; and so on. Those skilled in the art will understand that the huffman table of FIG. 5 is just one of an infinite number of different schemes for mapping from fixed-length data to variable-length codes. It will also be understood that the huffman table of FIG. 5 is an example of a structured huffman table, where shorter variable-length codes are used to represent smaller values. In general, huffman tables need not comply with such a structure rule.

As long as the frequencies of all of the fixed-length data values of any given row of the table are greater than all of the frequencies of the fixed-length data of the next lower row, then the huffman table of FIG. 5 will provide optimal VL coding for that set of fixed-length data (given the syntax of the huffman table). If however one of the fixed-length data values of a particular row occurs more frequently than at least one of the fixed-length data values of a higher row, then the huffman table will not provide optimal encoding of that particular set of fixed-length data.

For example, according to the huffman table of FIG. 5, the decimal value 5 is represented by the 4-bit VL code 1011 and the decimal value 7 is represented by the 6-bit VL code 110001. If the decimal value 7 occurs more frequently than the decimal value 5 in a particular set of fixed-length data to be VL encoded, then it may be more efficient to swap the VL codes for 5 and 7. That is, use the shorter VL code 1011 to represent the more frequently occurring value 7 and use the longer VL code 110001 to represent the less frequently occurring value 5. In this way, the total number of bits used to represented the set of fixed-length data may be reduced.

If the encoder is going to swap codes in the defined huffman table, it must somehow notify the decoder of the code swap so that the decoder can accurately decode the encoded data. This may be done by explicitly identifying the codes to be swapped in the encoded bitstream. Swapping two codes will increase the overall efficiency of VL encoding as long as the number of bits saved by making the swap is greater than the number of bits used to identify the code swaps in the bitstream.

The savings S in bits that can be achieved by swapping a pair of codes is represented in Equation (1) as follows:

$$S=[(F1-F2)\cdot(L1-L2)\cdot N]-C,$$

where Fi is the frequency with which data value i occurs, Li is the number of bits in the VL code used to represent data value i, N is the number of fixed-length data values in the set to be VL encoded, and C is the cost in number of bits required to identify the code swap in the bitstream. If S is positive, then swapping the codes for the two data values will increase the efficiency of VL encoding (i.e., reduce the total number of bits in the bitstream).

Figure 6:
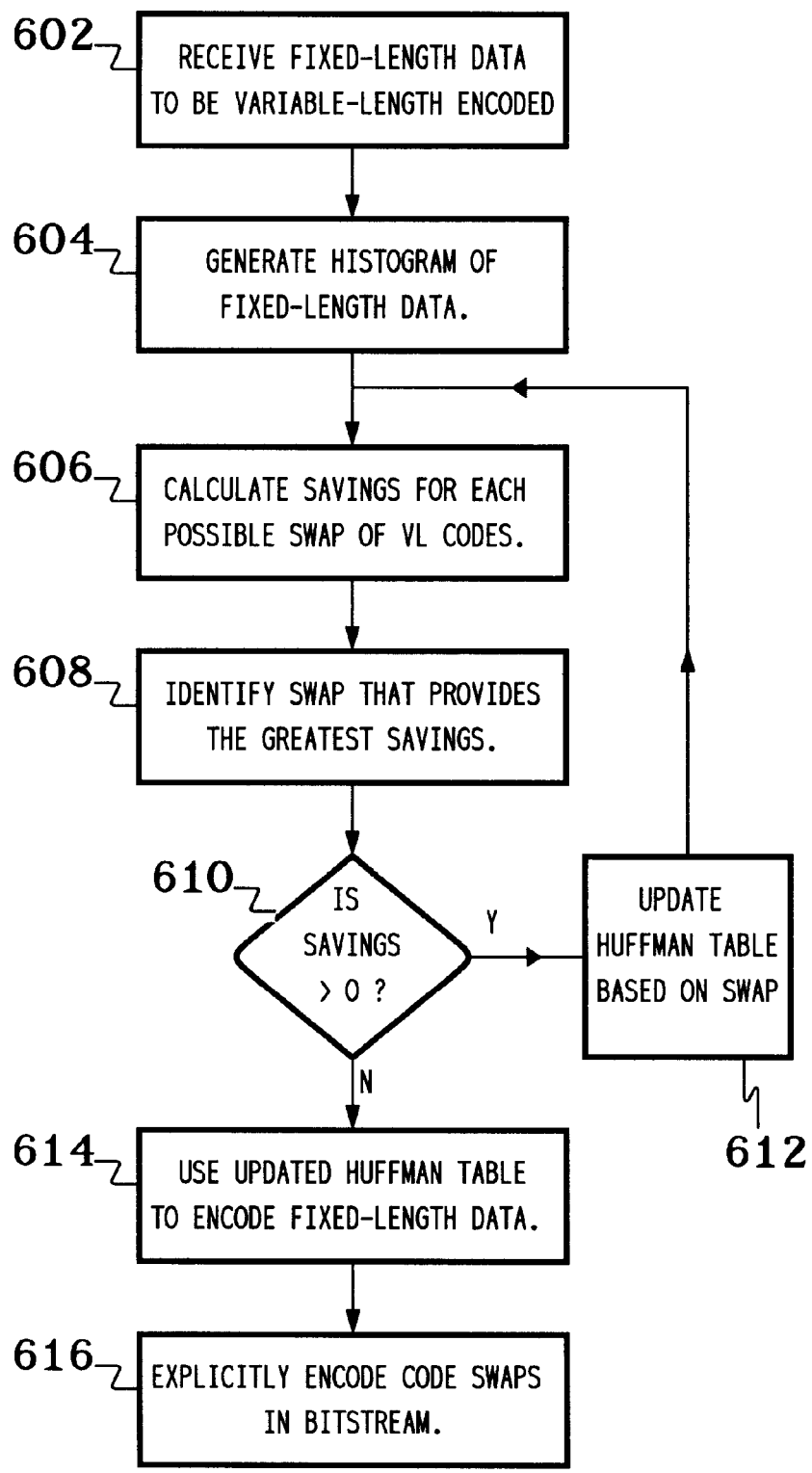
FIG. 6 is a flow diagram of the processing of the huffman encoder of FIG. 3.

Referring now to FIG. 6, there is shown a flow diagram of the processing of huffman encoder 312 of FIG. 3, according to a preferred embodiment of the present invention. Huffman encoder 312 identifies code swaps that would increase the overall efficiency of VL encoding for a particular set of fixed-length data to be VL encoded (taking into account the cost of encoding the swaps in the bitstream) and then uses those code swaps to VL encode the data.

In particular, huffman encoder 312 receives a set of fixed-length RLE data from run-length encoder 310 to be VL encoded (step 602 of FIG. 6). Huffman encoder 312 then generates a histogram indicating the frequencies with which the different fixed-length data values occur in the set (step 604). For each of the possible swaps of codes in the specified huffman table, huffman encoder 312 determines (using Equation (1)) the savings associated with each swap (step 606) and identifies the swap that would produce the greatest savings (step 608). If the savings provided by that swap are positive (step 610), then huffman encoder 312 updates the huffman table based on that swap (step 612) and returns to step 606 to repeat the processing of steps 606–610 for the updated huffman table.

If the savings provided by the most effective swap of the current huffman table are not positive (step 610), then no more code swaps will improve the overall efficiency of VL coding of the current set of data. In that case, the updated huffman table (based on all of the selected code swaps) is used to encode the set of fixed-length data (step 614). The selected code swaps are explicitly encoded into the bitstream along with the VL codes generated for the current set of data (step 616).

Those skilled in the art will understand that, by restricting code swaps to those that improve the overall efficiency of VL encoding, unproductive code swaps are avoided. An unproductive code swap is one that produces a net increase in the size of the encoded bitstream when taking into account the cost of identifying the code swap in the bitstream. For example, referring again to the huffman table of FIG. 5, even if decimal value 125 occurs more frequently in the current set of data than decimal value 62, there is no advantage to making such a swap since both decimal values are represented by 10-bit VL codes. Similarly, even in the case where two decimal values are presented by VL codes having different numbers of bits, if the difference between the frequencies of occurrence of those decimal values is too small, then it may cost more bits to encode the swap than those saved by making the swap. In that case, too, the code swap will be ignored.

Figure 7:
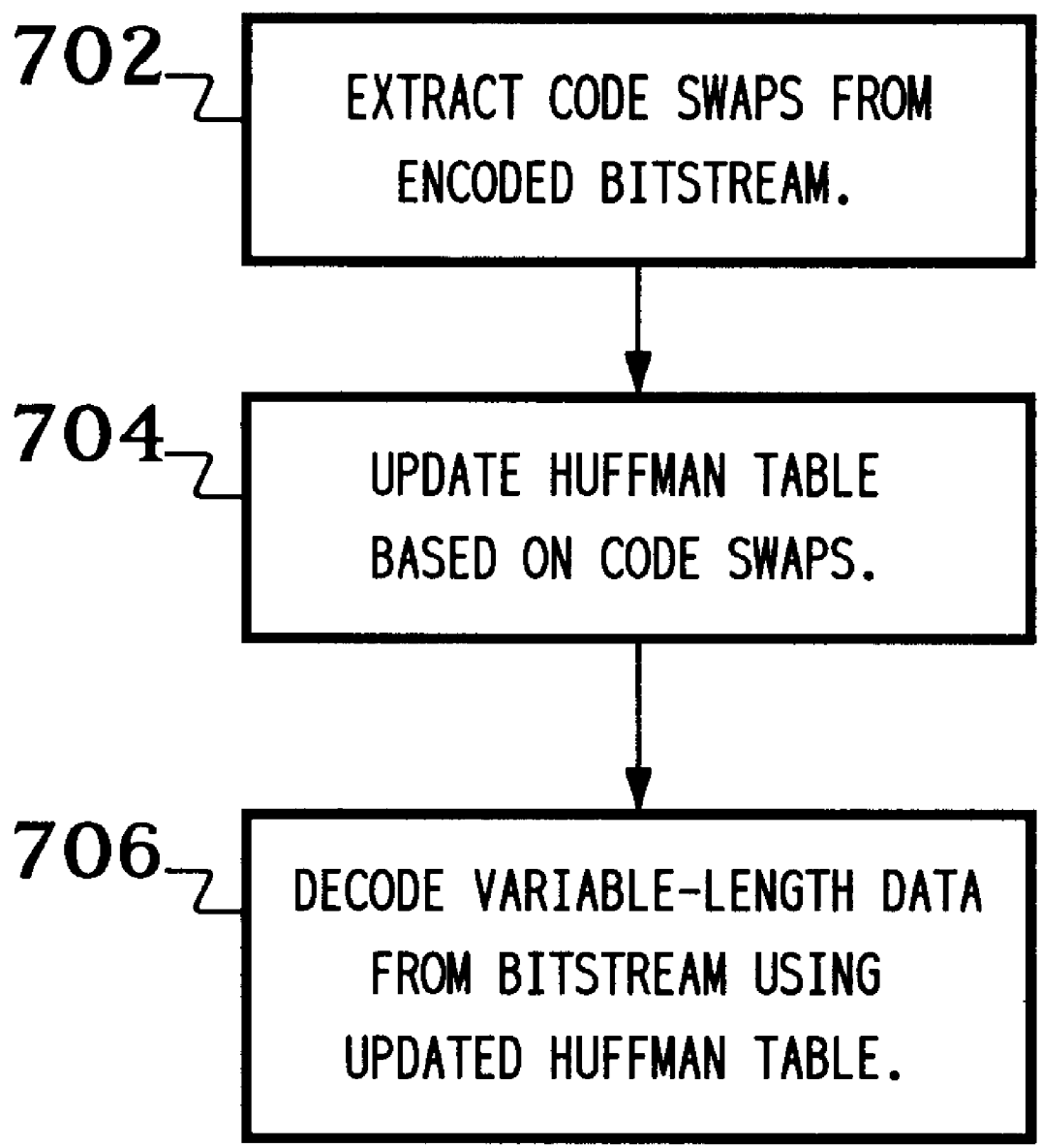
FIG. 7 is a flow diagram of the processing of the huffman decoder of FIG. 4.

Referring now to FIG. 7, there is shown a flow diagram of the processing of huffman decoder 402 of FIG. 4, according to a preferred embodiment of the present invention. Huffman decoder 402 decodes the variable-length codes generated by huffman encoder 312 of FIG. 3.

In particular, huffman decoder 402 extracts the code swaps from the encoded bitstream (step 702 of FIG. 7) and updates the defined huffman table based on those code swaps (step 704). Huffman decoder 402 then decodes the VL codes in the bitstream using the updated huffman table (step 706).

In a preferred embodiment, the encoder and decoder are preprogrammed with a single defined huffman table that can be updated by code swapping. Alternatively, the encoder and decoder may select from a set of defined huffman tables. In this case, the encoder selects one of the defined huffman tables for each set of data to be variable-length encoded and explicitly specifies the selected huffman table (along with any code swaps) in the bitstream.

In this specification, the term "defined," as used with a huffman table or other VL encoding table, can apply to different situations. One situation is where the encoder and decoder are explicitly preprogrammed with a single huffman table. In this case, the bitstream need only identify the changes (e.g., code swaps) to that preprogrammed huffman table. Another situation is where the encoder and decoder are explicitly preprogrammed with two or more different huffman tables. In this case, the bitstream identifies the huffman table (e.g., by a table number) as well as any changes to that table. In both of these situations, the huffman tables can be any generalized or structured huffman table. Yet another situation is where the one or more huffman tables are limited to structured huffman tables. FIG. 5 shows an example of a structured huffman table. In this case, the decoder does not have to be preprogrammed with the huffman tables. Rather, the bitstream can include a definition of the structure of the particular huffman table (e.g., by identifying the number of free suffix bits in each row of the table) in addition to any code swaps for that structured table. All of these situations involve "defined" huffman tables as the term is used in this specification.

In the examples presented above, the present invention was explained in the context of encoding video and other image signals. Those skilled in the art will understand that the present invention can be used in other processing that relies on VL encoding to represent signals that are representative of or constituting physical activity or objects. For example, audio signals can be encoded using the VL code swapping of the present invention.

The present invention can be embodied in the form of computer-implemented processes and apparatuses for practicing those processes. The present invention can also be embodied in the form of computer program code embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented process for encoding signals, comprising the steps of:
   (a) receiving data representing physical subject matter to be variable-length (VL) encoded using a defined VL encoding table;
   (b) characterizing efficiency of encoding the data using the defined VL encoding table;
   (c) determining one or more changes to one or more entries of the defined VL encoding table that increase the efficiency of encoding the data;
   (d) generating an updated VL encoding table from the defined VL encoding table based on the changes;
   (e) generating VL codes for the data using the updated VL encoding table; and
   (f) generating an encoded bitstream from the VL codes, wherein the encoded bitstream explicitly identifies the changes.

2. The process of claim 1, wherein the data represent video signals and the defined VL encoding table is a huffman table.

3. The process of claim 2, wherein the encoded bitstream identifies pairs of entries of the defined huffman table that are to be swapped.

4. The process of claim 3, wherein swapping each pair of entries ensures that the efficiency of the encoding is increased taking into account cost of explicitly encoding the pair of swapped entries in the bitstream.

5. The process of claim 4, wherein savings from swapping a pair of entries is represented by:

$$S=[(F1-F2) \cdot (L1-L2) \cdot N] - C,$$

wherein:
   F1 is frequency with which a first data value occurs;
   F2 is frequency with which a second data value occurs;
   L1 is number of bits in the VL code used to represent the first data value;
   L2 is number of bits in the VL code used to represent the second data value;
   N is number of data values to be VL encoded; and
   C is cost in number of bits required to identify the swapped pair of entries in the bitstream.

6. The process of claim 1, wherein step (a) comprises the step of selecting the defined VL encoding table from a set of defined VL encoding tables, wherein the selected table is explicitly identified in the encoded bitstream.

7. An apparatus for encoding signals, comprising:
   (a) means for receiving data representing physical subject matter to be variable-length (VL) encoded using a defined VL encoding table;
   (b) means for characterizing efficiency of encoding the data using the defined VL encoding table;
   (c) means for determining one or more changes to one or more entries of the defined VL encoding table that increase the efficiency of encoding the data;
   (d) means for generating an updated VL encoding table from the defined VL encoding table based on the changes;
   (e) means for generating VL codes for the data using the updated VL encoding table; and
   (f) means for generating an encoded bitstream from the VL codes, wherein the encoded bitstream explicitly identifies the changes.

8. The apparatus of claim 7, wherein the data represent video signals and the defined VL encoding table is a huffman table.

9. The apparatus of claim 8, wherein the encoded bitstream identifies pairs of entries of the defined huffman table that are to be swapped.

10. The apparatus of claim 9, wherein swapping each pair of entries ensures that the efficiency of the encoding is increased taking into account cost of explicitly encoding the pair of swapped entries in the bitstream.

11. The apparatus of claim 10, wherein savings from swapping a pair of entries is represented by:

$$S=[(F1-F2) \cdot (L1-L2) \cdot N] - C,$$

wherein:
   F1 is frequency with which a first data value occurs;
   F2 is frequency with which a second data value occurs;
   L1 is number of bits in the VL code used to represent the first data value;
   L2 is number of bits in the VL code used to represent the second data value;
   N is number of data values to be VL encoded; and
   C is cost in number of bits required to identify the swapped pair of entries in the bitstream.

12. The apparatus of claim 7, wherein means (a) selects the defined VL encoding table from a set of defined VL encoding tables, wherein the selected table is explicitly identified in the encoded bitstream.

13. A storage medium encoded with machine-readable computer program code for encoding signals, comprising:
   (a) means for causing a computer to receive data representing physical subject matter to be variable-length (VL) encoded using a defined VL encoding table;
   (b) means for causing the computer to characterize efficiency of encoding the data using the defined VL encoding table;
   (c) means for causing the computer to determine one or more changes to one or more entries of the defined VL encoding table that increase the efficiency of encoding the data;
   (d) means for causing the computer to generate an updated VL encoding table from the defined VL encoding table based on the changes;
   (e) means for causing the computer to generate VL codes for the data using the updated VL encoding table; and
   (f) means for causing the computer to generate an encoded bitstream from the VL codes, wherein the encoded bitstream explicitly identifies the changes.

14. The storage medium of claim 13, wherein the data represent video signals and the defined VL encoding table is a huffman table.

15. The storage medium of claim 14, wherein the encoded bitstream identifies pairs of entries of the defined huffman table that are to be swapped.

16. The storage medium of claim 15, wherein swapping each pair of entries ensures that the efficiency of the encoding is increased taking into account cost of explicitly encoding the pair of swapped entries in the bitstream.

17. The storage medium of claim 16, wherein savings from swapping a pair of entries is represented by:

$$S=[(F1-F2) \cdot (L1-L2) \cdot N] - C,$$

wherein:

F1 is frequency with which a first data value occurs;

F2 is frequency with which a second data value occurs;

L1 is number of bits in the VL code used to represent the first data value;

L2 is number of bits in the VL code used to represent the second data value;

N is number of data values to be VL encoded; and

C is cost in number of bits required to identify the swapped pair of entries in the bitstream.

18. The storage medium of claim 13, wherein means (a) causes the computer to select the defined VL encoding table from a set of defined VL encoding tables, wherein the selected table is explicitly identified in the encoded bitstream.

19. A variable-length encoder for encoding signals, wherein the variable-length encoder:
   (a) receives data representing physical subject matter to be variable-length (VL) encoded using a defined VL encoding table;
   (b) characterizes efficiency of encoding the data using the defined VL encoding table;
   (c) determines one or more changes to one or more entries of the defined VL encoding table that increase the efficiency of encoding the data;
   (d) generates an updated VL encoding table from the defined VL encoding table based on the changes;
   (e) generates VL codes for the data using the updated VL encoding table; and
   (f) generates an encoded bitstream from the VL codes, wherein the encoded bitstream explicitly identifies the changes.

20. The variable-length encoder of claim 19, wherein the data represent video signals and the defined VL encoding table is a huffman table.

21. The variable-length encoder of claim 20, wherein the encoded bitstream identifies pairs of entries of the defined huffman table that are to be swapped.

22. The variable-length encoder of claim 21, wherein swapping each pair of entries ensures that the efficiency of the encoding is increased taking into account cost of explicitly encoding the pair of swapped entries in the bitstream.

23. The variable-length encoder of claim 22, wherein savings from swapping a pair of entries is represented by:

$$S=[(F1-F2)\cdot(L1-L2)\cdot N]-C,$$

wherein:

F1 is frequency with which a first data value occurs;

F2 is frequency with which a second data value occurs;

L1 is number of bits in the VL code used to represent the first data value;

L2 is number of bits in the VL code used to represent the second data value;

N is number of data values to be VL encoded; and

C is cost in number of bits required to identify the swapped pair of entries in the bitstream.

24. The variable-length encoder of claim 19, wherein the variable-length encoder selects the defined VL encoding table from a set of defined VL encoding tables, wherein the selected table is explicitly identified in the encoded bitstream.

25. A computer-implemented process for decoding variable-length (VL) encoded signals, comprising the steps of:
   (a) receiving an encoded bitstream comprising VL codes representing physical subject matter, wherein:
      the VL codes were generated using a defined VL encoding table that had been updated using one or more changes to one or more entries of the defined VL encoding table; and
      the changes were explicitly encoded into the encoded bitstream;
   (b) extracting the changes from the encoded bitstream;
   (c) generating an updated VL decoding table from a defined VL decoding table corresponding to the defined VL encoding table, based on the changes; and
   (d) decoding the VL codes using the updated VL decoding table to generate decoded data.

26. The process of claim 25, wherein the decoded data represent video signals and the defined VL decoding table is a huffman table.

27. The process of claim 26, wherein the encoded bitstream identifies pairs of entries of the defined huffman table that are to be swapped.

28. The process of claim 27, wherein swapping each pair of entries ensures that the efficiency of the encoding was increased taking into account cost of explicitly encoding the pair of swapped entries in the bitstream.

29. The process of claim 28, wherein savings from swapping a pair of entries is represented by:

$$S=[(F1-F2)\cdot(L1-L2)\cdot N]-C,$$

wherein:

F1 is frequency with which a first data value occurs;

F2 is frequency with which a second data value occurs;

L1 is number of bits in the VL code used to represent the first data value;

L2 is number of bits in the VL code used to represent the second data value;

N is number of data values to be VL encoded; and

C is cost in number of bits required to identify the swapped pair of entries in the bitstream.

30. The process of claim 25, wherein step (c) comprises the step of selecting the defined VL decoding table from a set of defined VL decoding tables, wherein the selected table is explicitly identified in the encoded bitstream.

31. An apparatus for decoding variable-length (VL) encoded signals, comprising:
   (a) means for receiving an encoded bitstream comprising VL codes representing physical subject matter, wherein:
      the VL codes were generated using a defined VL encoding table that had been updated using one or more changes to one or more entries of the defined VL encoding table; and
      the changes were explicitly encoded into the encoded bitstream;
   (b) means for extracting the changes from the encoded bitstream;
   (c) means for generating an updated VL decoding table from a defined VL decoding table corresponding to the defined VL encoding table, based on the changes; and
   (d) means for decoding the VL codes using the updated VL decoding table to generate decoded data.

32. The apparatus of claim 31, wherein the decoded data represent video signals and the defined VL decoding table is a huffman table.

33. The apparatus of claim 32, wherein the encoded bitstream identifies pairs of entries of the defined huffman table that are to be swapped.

34. The apparatus of claim 33, wherein swapping each pair of entries ensures that the efficiency of the encoding was increased taking into account cost of explicitly encoding the pair of swapped entries in the bitstream.

35. The apparatus of claim 34, wherein savings from swapping a pair of entries is represented by:

$$S=[(F1-F2)\cdot(L1-L2)\cdot N]-C,$$

wherein:
- F1 is frequency with which a first data value occurs;
- F2 is frequency with which a second data value occurs;
- L1 is number of bits in the VL code used to represent the first data value;
- L2 is number of bits in the VL code used to represent the second data value;
- N is number of data values to be VL encoded; and
- C is cost in number of bits required to identify the swapped pair of entries in the bitstream.

36. The apparatus of claim 31, wherein means (c) selects the defined VL decoding table from a set of defined VL decoding tables, wherein the selected table is explicitly identified in the encoded bitstream.

37. A storage medium encoded with machine-readable computer program code for decoding variable-length (VL) encoded signals, comprising:
  (a) means for causing a computer to receive an encoded bitstream comprising VL codes representing physical subject matter, wherein:
    the VL codes were generated using a defined VL encoding table that had been updated using one or more changes to one or more entries of the defined VL encoding table; and
    the changes were explicitly encoded into the encoded bitstream;
  (b) means for causing the computer to extract the changes from the encoded bitstream;
  (c) means for causing the computer to generate an updated VL decoding table from a defined VL decoding table corresponding to the defined VL encoding table, based on the changes; and
  (d) means for causing the computer to decode the VL codes using the updated VL decoding table to generate decoded data.

38. The storage medium of claim 37, wherein the decoded data represent video signals and the defined VL decoding table is a huffman table.

39. The storage medium of claim 38, wherein the encoded bitstream identifies pairs of entries of the defined huffman table that are to be swapped.

40. The storage medium of claim 39, wherein swapping each pair of entries ensures that the efficiency of the encoding was increased taking into account cost of explicitly encoding the pair of swapped entries in the bitstream.

41. The storage medium of claim 40, wherein savings from swapping a pair of entries is represented by:

$$S=[(F1-F2)\cdot(L1-L2)\cdot N]-C,$$

wherein:
- F1 is frequency with which a first data value occurs;
- F2 is frequency with which a second data value occurs;
- L1 is number of bits in the VL code used to represent the first data value;
- L2 is number of bits in the VL code used to represent the second data value;
- N is number of data values to be VL encoded; and
- C is cost in number of bits required to identify the swapped pair of entries in the bitstream.

42. The storage medium of claim 37, wherein means (c) causes the computer to select the defined VL decoding table from a set of defined VL decoding tables, wherein the selected table is explicitly identified in the encoded bitstream.

43. A variable-length decoder for decoding variable-length (VL) encoded signals, wherein the variable-length decoder:
  (a) receives an encoded bitstream comprising VL codes representing physical subject matter, wherein:
    the VL codes were generated using a defined VL encoding table that had been updated using one or more changes to one or more entries of the defined VL encoding table; and
    the changes were explicitly encoded into the encoded bitstream;
  (b) extracts the changes from the encoded bitstream;
  (c) generates an updated VL decoding table from a defined VL decoding table corresponding to the defined VL encoding table, based on the changes; and
  (d) decodes the VL codes using the updated VL decoding table to generate decoded data.

44. The variable-length decoder of claim 43, wherein the decoded data represent video signals and the defined VL decoding table is a huffman table.

45. The variable-length decoder of claim 44, wherein the encoded bitstream identifies pairs of entries of the defined huffman table that are to be swapped.

46. The variable-length decoder of claim 45, wherein swapping each pair of entries ensures that the efficiency of the encoding was increased taking into account cost of explicitly encoding the pair of swapped entries in the bitstream.

47. The variable-length decoder of claim 46, wherein savings from swapping a pair of entries is represented by:

$$S=[(F1-F2)\cdot(L1-L2)\cdot N]-C,$$

wherein:
- F1 is frequency with which a first data value occurs;
- F2 is frequency with which a second data value occurs;
- L1 is number of bits in the VL code used to represent the first data value;
- L2 is number of bits in the VL code used to represent the second data value;
- N is number of data values to be VL encoded; and
- C is cost in number of bits required to identify the swapped pair of entries in the bitstream.

48. The variable-length decoder of claim 43, wherein the variable-length decoder selects the defined VL decoding table from a set of defined VL decoding tables, wherein the selected table is explicitly identified in the encoded bitstream.

* * * * *